United States Patent
Dutartre

[11] Patent Number: 6,132,806
[45] Date of Patent: Oct. 17, 2000

[54] METHOD OF IMPLEMENTATION OF MOS TRANSISTOR GATES WITH A HIGH CONTENT

[75] Inventor: Didier Dutartre, Meylan, France

[73] Assignee: SGS-Thomson Microelectronics S.A., Gentilly, France

[21] Appl. No.: 09/106,571

[22] Filed: Jun. 29, 1998

[30] Foreign Application Priority Data

Jun. 30, 1997 [FR] France .................................. 97 08457

[51] Int. Cl.[7] .................................................. C23C 16/24
[52] U.S. Cl. ................................ 427/255.18; 427/255.7; 427/126.1; 427/419.7; 438/592; 438/652; 438/657
[58] Field of Search ........................... 427/255.7, 255.18, 427/126.1, 419.7; 438/592, 652, 657

[56] References Cited

U.S. PATENT DOCUMENTS

| | | | |
|---|---|---|---|
| 5,019,882 | 5/1991 | Solomon et al. .................... | 357/23.8 |
| 5,714,777 | 2/1998 | Ismail et al. ......................... | 257/263 |
| 5,907,789 | 5/1999 | Komatsu ............................... | 438/649 |

OTHER PUBLICATIONS

Ozturk, M.C., et al., "Rapid Thermal Chemical Vapor Deposition Of Germanium and Germanium/Silicon Alloys on Silicon; New Applications In The Fabrication Of MOS Transistors", Rapid Thermal And Integrated Processing Symposium, Anaheim, CA, USA Apr. 30–May 3, 1991, 1991 Pittsburgh, PA, USA, Mater. Res. Soc, USA, pp. 223–234.

Primary Examiner—Roy V. King
Attorney, Agent, or Firm—Wolf, Greenfield & Sacks, P.C.; James H. Morris; Theodore E. Galanthay

[57] ABSTRACT

The present invention relates to a method of formation of an $Si_{1-x}Ge_x$ MOS transistor gate where x is higher than 50%, on an silicon oxide gate insulator layer, consisting of depositing an $Si_{1-y}Ge_y$ layer of thickness lower than 10 nm, where $0<y<30\%$; and depositing an $Si_{1-z}Ge_z$ layer of desired thickness, where $z>50\%$. The desired thickness ranges, for example, between 20 nm and 200 nm. x and z range, for example, between 80% and 90%.

6 Claims, 1 Drawing Sheet

METHOD OF IMPLEMENTATION OF MOS TRANSISTOR GATES WITH A HIGH CONTENT

BACKGROUND OF THE INVENTION

1. Field of the Invention

The present invention relates to manufacturing of semiconductor components and more specifically of MOS transistors in a silicon substrate.

2. Discussion of the Related Art

Currently, MOS transistors manufactured on a silicon substrate have polysilicon gates separated from the substrate by a thin silicon oxide layer. It is known that the threshold voltage of MOS transistors especially depends on the nature of the material forming the conductive gate above this thin silicon oxide layer. Especially, the fact of providing as a gate material germanium or a mixture $Si_{1-x}Ge_x$ of silicon and germanium, with x>50%, heavily doped of type P, is known to allow obtaining N-channel and P-channel MOS transistors, the threshold voltages of which are close to 0.6 volt.

However, the implementation of such $Si_{1-x}Ge_x$-gate transistors raises various practical problems. One of these is that germanium and/or mixtures of germanium and silicon with a high germanium content are difficult to deposit on silicon oxide and that rough and irregular surfaces are obtained. Further, $GeH_x$ radicals, present in the chemical vapor deposition process (CVD) performed in presence of silane and germane, are very reactive and strongly reductive and therefore there is a risk of etching the surface of the thin gate insulation layer, whereby this layer, after deposition, no longer has the desired electric qualities and/or has an irregular thickness.

SUMMARY OF THE INVENTION

Thus, an object of the present invention is to provide a method of formation of an $Si_{1-x}Ge_x$ MOS transistor gate which enables the deposition of a gate of a regular thickness without affecting the underlying oxide layer.

Although the present invention refers as an example to a MOS transistor gate, those skilled in the art will understand that the present invention generally applies to the case where it is desired to form an $Si_{1-x}Ge_x$ layer with x being higher than 50% on a thin oxide layer to form components other than a MOS transistor, for example memory cells of various types.

To achieve this and other objects, the present invention provides a method of formation of an $Si_{1-x}Ge_x$ MOS transistor gate where x is higher than 50%, on a silicon oxide gate insulator layer, including the steps of depositing an $Si_{1-y}Ge_y$ layer of thickness lower than 10 nm, where 0<y<30%; and depositing an $Si_{1-z}Ge_z$ layer of desired thickness, where z>50%.

According to an embodiment of the present invention, the desired thickness ranges between 20 nm and 200 nm.

According to an embodiment of the present invention, x and z range between 80% and 90%.

According to an embodiment of the present invention, the method further includes the step of depositing a polysilicon encapsulation layer.

According to an embodiment of the present invention, the method includes, before the deposition of the encapsulation layer, the step of depositing a layer forming a diffusion barrier for the silicon and the germanium.

According to an embodiment of the present invention, the barrier layer is a titanium nitride layer, possibly deposited on a titanium bonding layer.

The foregoing objects, features and advantages of the present invention will be discussed in detail in the following non-limiting description of specific embodiments in connection with the accompanying drawings.

DETAILED DESCRIPTION

As is usual in the field of the representation of semiconductor components, the various cross-sectional views are not drawn to scale.

Figure 1:
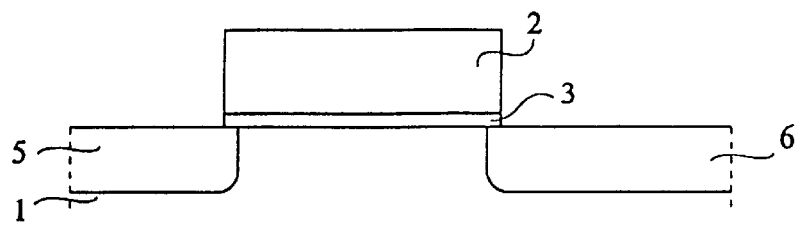
FIG. 1 shows a cross-sectional view of a structure which is desired to be obtained.

FIG. 1 very schematically shows the shape of a MOS transistor including, above a substrate, a conductive gate layer 2 separated from the substrate by a thin insulating layer 3 and including in the substrate, on either side of gate 2, source and drain regions 5 and 6.

As previously indicated, one object of the present invention is to implement such a structure in which the substrate is made of single crystal silicon, gate insulator 3 is made of silicon oxide of a thickness on the order of 2 nm to 8 nm, and the gate 2 of which is made of germanium or of $Si_{1-x}Ge_x$ with x higher than 50% and preferably between 80% and 90%.

Figure 2:
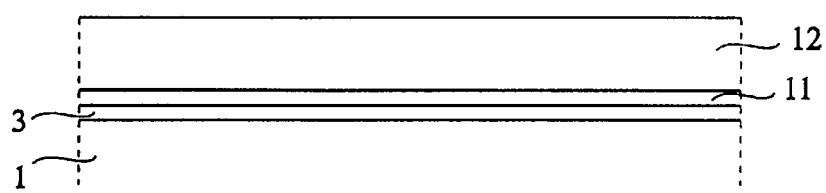
FIG. 2 schematically shows the method according to the present invention.

To achieve this object and avoid the problems of deposition of a layer of germanium or $Si_{1-x}Ge_x$ directly on a silicon oxide layer, the present invention provides, as illustrated in FIG. 2, to deposit above silicon oxide 3 formed on substrate 1, successively a first thin silicon or $Si_{1-y}Ge_y$ layer 11 with 0<y<30%, then a $Si_{1-z}Ge_z$ layer 12 with z>50%, preferably included between 70 and 90%. $Si_{1-y}Ge_y$ layer 11 has a very small thickness, for example, between 1 and 10 nm and layer 12 has the thickness desired for the gate, for example, on the order of 20 to 200 nm.

Layer 11 is deposited by any conventional polysilicon deposition method, for example, by chemical vapor deposition (CVD) at a temperature ranging between 450° C. and 650° C. and in pressure conditions chosen especially according to the desired growth rate. This polysilicon deposition is generally performed from silane in a silane and hydrogen atmosphere. Germane ($GeH_4$) at a sufficiently low concentration so as not to risk reducing the gate insulator layer and to maintain a regular deposition, may be added to the deposition atmosphere.

Layer 12 is also deposited by chemical vapor deposition from silane and germane, with a majority germane concentration. $Si_{1-z}Ge_z$ layer 12 appears to deposit without any particular problem (neither nucleation, nor roughness) above a polysilicon layer, possibly with a low germanium content. This deposition is also performed at a temperature on the order of 400° C. to 600° C.

After the thorough implementation of the device, it is acknowledged that the assembly of layers 11 and 12 forms a layer of uniform $Si_{1-x}Ge_x$ composition having the desired content, provided that the silicon and germanium proportions in each of layers 11 and 12 have been properly chosen. This results from a diffusion of the silicon into the germanium. This diffusion starts occurring at the deposition temperatures of layer 12, then occurs during the subsequent thermal steps of manufacturing of the device, for example, the source and drain thermal anneal which currently implies temperatures on the order of 100° C. during several seconds, and/or during the steps of deposition of silicon oxide layers deposited between metallization levels, these steps currently implying temperatures on the order of 800° C. during several minutes. Of course, the thickness of layer 11 will be chosen to be sufficiently low for the silicon diffusion into the germanium to result in a dissolution of layer 11 into layer 12. This thickness will preferably be, as previously indicated, on the order of 1 nm to 10 nm.

During further manufacturing steps, it is generally desired to establish a contact with the gate and/or perform a metallization thereof. Given that well known methods in the field of semiconductor manufacturing use polysilicon gates and contact recovery areas on the polysilicon gates, it is generally desired to avoid having to develop a specific method to establish contacts on germanium or $Si_{1-x}Ge_x$ with x higher than 50%.

Figure 3:
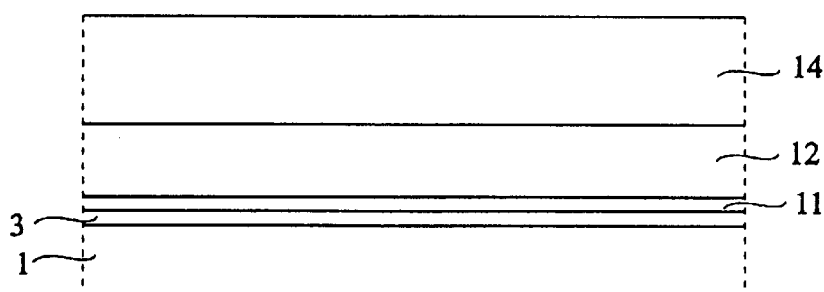
FIG. 3 shows a first alternative of the method according to the present invention.

Accordingly, as shown in FIG. 3, the deposition of an additional polysilicon layer 14 will preferably be performed, after the step illustrated in FIG. 2, as is shown in FIG. 3. Layer 14 further forms an encapsulation layer which protects layer 12 from etchings by oxides or acids. Given the thickness of layer 12, even if, during subsequent thermal steps, there occurs a certain mutual diffusion of the silicon of layer 14 and of the germanium of layer 12 towards each other, a wide portion of layer 12, in the vicinity of the gate oxide layer, will remain an $Si_{1-x}Ge_x$ region where x has a desired value to set the threshold voltage of a MOS transistor. In subsequent steps, not shown, the etching of the entire gate conductor layer will be performed to form gates of desired shape and dimension.

Figure 4:
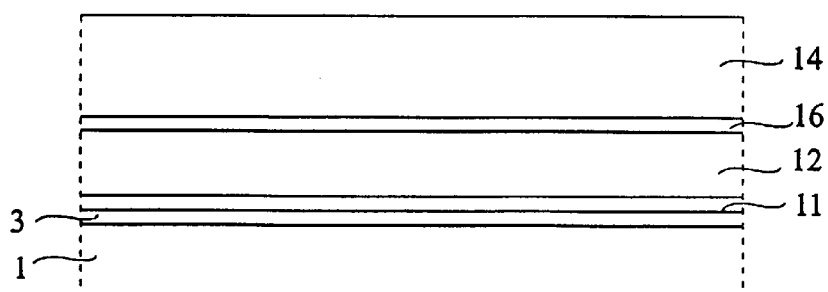
FIG. 4 shows a second alternative of the method according to the present invention.

According to an alternative of the present invention, illustrated in FIG. 4, before depositing layer 14, an intermediary diffusion barrier layer is formed to avoid any reduction of the germanium doping of region 11, 12. This diffusion barrier layer will for example be titanium nitride, or titanium nitride deposited on a titanium bonding layer. Other known diffusion barriers may be used.

Finally, the present invention is likely to have various alterations, modifications, and improvements which will readily occur to those skilled in the art, the essential aspect of the present invention being the use of a deposition of non-negligible thickness, from 1 to 10 nm, silicon rich, before the deposition of a germanium rich gate conductor layer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of formation of an $Si_{1-x}Ge_x$ MOS transistor gate where x is higher than 50%, on a silicon oxide gate insulator layer, including the steps of:

(a) depositing an $Si_{1-y}Ge_y$ layer of thickness lower than 10 mn, where 0<y<30%; and (b) after step (a), depositing an $Si_{1-z}Ge_z$ layer of desired thickness, where z>50%.

2. The method of claim 1, wherein the desired thickness ranges between 20 nm and 200 nm.

3. The method of claim 1, wherein x and z range between 80% and 90%.

4. The method of claim 1, further including the step of depositing a polysilicon encapsulation layer.

5. The method of claim 4, including, before the deposition of the encapsulation layer, the step of depositing a layer forming a diffusion barrier for the silicon and the germanium.

6. The method of claim 5, wherein the barrier layer is a titanium nitride layer.

* * * * *